(12) United States Patent
Hong et al.

(10) Patent No.: US 8,450,160 B2
(45) Date of Patent: May 28, 2013

(54) FLATTENING METHOD OF A SUBSTRATE

(75) Inventors: Pil Soon Hong, Gwangmyeong-si (KR); Gwui-Hyun Park, Osan-si (KR); Sang Gab Kim, Seoul (KR)

(73) Assignee: Samsung Display Co., Ltd. (KR)

( * ) Notice: Subject to any disclaimer, the term of this patent is extended or adjusted under 35 U.S.C. 154(b) by 251 days.

(21) Appl. No.: 13/074,296

(22) Filed: Mar. 29, 2011

(65) Prior Publication Data

US 2012/0149158 A1  Jun. 14, 2012

(30) Foreign Application Priority Data

Dec. 10, 2010 (KR) .................. 10-2010-0126287

(51) Int. Cl.
*H01L 21/84* (2006.01)

(52) U.S. Cl.
USPC .............. 438/160; 257/E21.561; 438/30

(58) Field of Classification Search
USPC .............. 438/151–166, 30; 257/E21.561
See application file for complete search history.

(56) References Cited

U.S. PATENT DOCUMENTS 4,587,720 A * 5/1986 Chenevas-Paule et al. ... 438/160
4,767,723 A * 8/1988 Hinsberg et al. .............. 438/160

FOREIGN PATENT DOCUMENTS

| JP | 2004-125950 A | 4/2004 |
| JP | 2004-126079 A | 4/2004 |
| JP | 2004-182998 A | 7/2004 |
| JP | 2005-048275 A | 2/2005 |
| JP | 2009-147104 A | 7/2009 |
| KR | 1019980034394 A | 8/1998 |
| KR | 1020080034140 A | 4/2008 |

* cited by examiner

*Primary Examiner* — Richard Booth
(74) *Attorney, Agent, or Firm* — Cantor Colburn LLP

(57) ABSTRACT

A method of flattening a substrate includes forming a metal layer on an upper surface of a substrate, forming a photoresist layer covering the substrate and the metal layer, radiating light to the photoresist layer, through a lower surface of the substrate opposite to the upper surface, exposing the metal layer by developing the photoresist layer, exposing the upper surface of the substrate by etching the metal layer, etching the exposed upper surface of the substrate, and removing the photoresist layer.

18 Claims, 7 Drawing Sheets

FLATTENING METHOD OF A SUBSTRATE

This application claims priority to Korean Patent Application No. 10-2010-0126287 filed on Dec. 10, 2010, and all the benefits accruing therefrom under 35 U.S.C. §119, the entire contents of which are incorporated herein by reference.

BACKGROUND OF THE INVENTION (1) Field of the Invention

The present invention relates to a flattening method of a substrate, and a method of manufacturing a thin film transistor array panel using the same.

(2) Description of the Related Art

In general, thin film transistor array panels are used as circuit boards for independently driving pixels in liquid crystal displays or organic electro luminescence ("EL") display devices. The thin film transistor array panels include a gate wire transmitting scan signals, a data wire transmitting image signals, a thin film transistor connected with the gate wire and the data wire, and a pixel electrode connected with the thin film transistor.

The thin film transistor is composed of a semiconductor layer forming a channel, a gate electrode of the gate wire, and a source electrode and a drain electrode of the data wire. The thin film transistor is a switching element that transmits or blocks data voltage transmitted through the data wire to the pixels, in response to a gate signal transmitted through the gate wire.

In manufacturing the thin film transistor, a metal layer is stacked first on a substrate as a wiring material for a gate or a source/drain electrode, and the metal layer is etched for implementing desired lines of an electric circuit. In the manufacturing process, portions of the metal layer are removed by using a gas or solution having corrosiveness.

The wires become narrow with the reduction in size and integration of the circuit, such that electrical resistance is relatively increased. Accordingly, copper has been under the spotlight as a row-resistant wiring material, instead of chromium, molybdenum, aluminum and alloys of them, which have been generally used as wiring materials in the related art.

However, copper does not bond well with a glass substrate or a silicon insulating layer, and is difficult to use in a single layer structure. A multilayer structure including the copper has been proposed. The multilayer structure uses a metal layer that bonds well with a glass substrate or a silicon insulating layer, for example a titanium layer, as a lower layer between the copper and the respective glass substrate or silicon insulating layer.

Etching solution containing fluoric acid is used to etch the entire multilayer. However, the etching solution containing fluoric acid etches not only the wires, but the substrate thereunder and leaves stains in subsequent manufacturing processes.

The above information disclosed in this Background section is only for enhancement of understanding of the background of the invention and therefore it may contain information that does not form the prior art that is already known in this country to a person of ordinary skill in the art.

BRIEF SUMMARY OF THE INVENTION

The present invention provides a method of flattening a substrate, where the method has advantages of etching a substrate with an etching solution without influencing the following processes.

An exemplary embodiment of the present invention provides a method of flattening a substrate, including, forming a metal layer on an upper surface of a substrate, forming a photoresist layer overlapping the substrate and the metal layer, radiating light to the photoresist layer, through a lower surface of the substrate opposite to the upper surface, exposing the metal layer by developing the photoresist layer, exposing the upper surface of the substrate by etching the metal layer, etching the exposed upper surface of the substrate, and removing the photoresist layer.

The radiating light to the photoresist layer may use the metal layer as a mask.

The metal layer may include a double layer comprising an upper layer and a lower layer, the lower layer may include titanium (Ti) and the upper layer may include copper (Cu).

The forming the metal layer on the upper surface of the substrate may include stacking a lower metal layer on the substrate, stacking an upper metal layer on the lower metal layer, forming a photoresist pattern on the upper metal layer, etching the upper metal layer and the lower metal layer with a first etchant using the photoresist pattern as a mask, and removing the photoresist pattern. In the etching the upper metal layer and the lower metal layer with a first etchant, a step portion of the substrate may be formed between a portion of the substrate which overlaps the lower metal layer and a portion of the substrate which is not covered by the photoresist pattern.

The first etchant may contain fluoric acid.

The photoresist layer may be a negative type.

The forming the metal layer on the upper surface of the substrate includes forming a step portion of the substrate, and the etching the exposed upper surface of the substrate removes the step portion of the substrate.

The etching the exposed upper surface of the substrate may use an etchant containing fluoric acid.

The substrate may be flattened or planarized, after the etching the exposed upper surface of the substrate.

Another exemplary embodiment of the present invention provides a method of manufacturing a thin film transistor array panel, including forming a first gate line on an upper surface of a substrate, forming a photoresist layer overlapping the substrate and the first gate line, radiating light to the photoresist layer, through a lower surface of the substrate opposite to the upper surface, exposing the first gate line by developing the photoresist layer, exposing the upper surface of the substrate by etching the first gate line, etching the exposed upper surface of the substrate, removing the photoresist layer, forming a second gate line on the substrate, forming a gate insulating layer on the second gate line, forming a semiconductor layer on the gate insulating layer, forming a data line including a source electrode and a drain electrode on the semiconductor layer, forming a passivation layer on the data line and the drain electrode, the passivation layer including a contact hole, and forming a pixel electrode connected with the drain electrode through the contact hole, on the passivation layer.

The radiating light to the photoresist layer may use the first gate line as a mask.

The first gate line and the second gate line may each include a double layer comprising an upper layer and a lower layer, the lower layer may including titanium (Ti), and the upper layer may including copper (Cu).

The forming the first gate line on the upper surface of the substrate may include stacking a lower metal layer on the substrate, stacking an upper metal layer on the lower metal layer, forming a photoresist pattern on the upper metal layer, etching the upper metal layer and the lower metal layer with a first etchant, using the photoresist pattern as a mask, and removing the photoresist pattern. In the etching the upper metal layer and the lower metal layer with a first etchant, a step portion of the substrate may be formed between a portion of the substrate which overlaps the lower metal layer and the portion of the substrate which is not overlapped by the photoresist pattern.

The first etchant may contain fluoric acid.

The photoresist layer may be a negative type.

The forming the first gate line on the upper surface of the substrate includes forming a step portion of the substrate, and the etching the exposed upper surface of the substrate removes the step portion.

The etching the exposed upper surface of the substrate may use an etchant containing fluoric acid.

The substrate may be flattened or planarized, after the etching the exposed upper surface of the substrate, and before the forming the second gate line on the upper surface of the substrate.

According to exemplary embodiments of the present invention, it is possible to solve the problem of stains in the following processes by flattening the substrate by using rear exposure.

BRIEF DESCRIPTION OF THE DRAWINGS

The above and other aspects and features of this disclosure will become more apparent by describing in further detail exemplary embodiments thereof with reference to the accompanying drawings, in which.

DETAILED DESCRIPTION OF THE INVENTION

Figure 1:
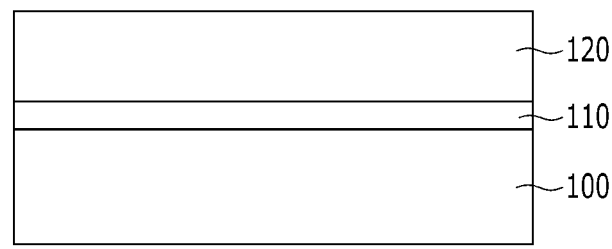
FIG. 1 to FIG. 7 are cross-sectional views illustrating an exemplary embodiment of a flattening method of a substrate according to the present invention.

The present invention will be described more fully hereinafter with reference to the accompanying drawings, in which exemplary embodiments of the invention are shown. As those skilled in the art would realize, the described embodiments may be modified in various different ways, all without departing from the spirit or scope of the present invention. The exemplary embodiments proposed herein are provided to make the description clearly and fully understood, and to sufficiently provide the scope of the present invention to a person of an ordinary skill in the art.

The thickness of layers and regions may be exaggerated for clarity in the drawings. Further, when a layer is referred to as being "on" another layer or a substrate, it can be directly on the other element of the substrate or intervening layers may also be present. Like reference numerals designate like elements throughout the specification.

It will be understood that, although the terms first, second, third, etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the invention.

Spatially relative terms, such as "lower," "under," "above," "upper" and the like, may be used herein for ease of description to describe the relationship of one element or feature to another element(s) or feature(s) as illustrated in the figures. It will be understood that the spatially relative terms are intended to encompass different orientations of the device in use or operation, in addition to the orientation depicted in the figures. For example, if the device in the figures is turned over, elements described as "lower" or "under" relative to other elements or features would then be oriented "above" relative to the other elements or features. Thus, the exemplary term "under" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Embodiments of the invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

All methods described herein can be performed in a suitable order unless otherwise indicated herein or otherwise clearly contradicted by context. The use of any and all examples, or exemplary language (e.g., "such as"), is intended merely to better illustrate the invention and does not pose a limitation on the scope of the invention unless otherwise claimed. No language in the specification should be construed as indicating any non-claimed element as essential to the practice of the invention as used herein.

Hereinafter, the invention will be described in detail with reference to the accompanying drawings.

FIG. 1 to FIG. 7 are cross-sectional views illustrating an exemplary embodiment of a flattening method of a substrate according to the present invention.

Referring to FIG. 1, a lower metal layer 110 and an upper metal layer 120 are sequentially formed on an upper surface of a substrate 100. The lower metal layer 110 may include titanium or a titanium alloy, and the upper metal layer 120 may include copper or a copper alloy. The lower metal layer 110 may have a thickness of about 10 angstroms (Å) to about 150 Å, and the upper metal layer 120 may have a thickness of 2000 Å to 5000 Å. The thicknesses are taken perpendicular to the substrate 100.

Figure 2:
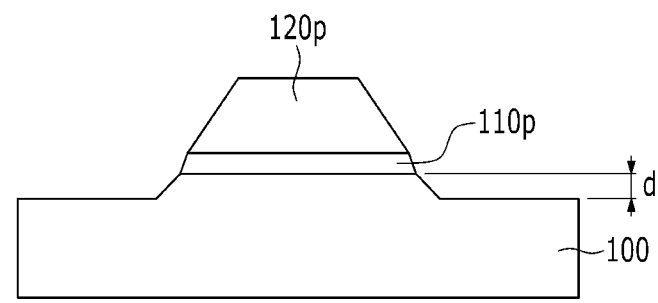

Referring to FIG. 2, a lower layer 110p and an upper layer 120p sequentially stacked on the substrate 100 are formed by collectively etching the upper metal layer 120 and the lower metal layer 110, such as by using photolithography. In detail, a photoresist pattern (not shown) is formed overlapping the upper metal layer 120, and the upper metal layer 120 and the lower metal layer 110 are etched at substantially a same time by using the photoresist pattern as a mask. The photoresist pattern may be formed overlapping only the upper metal layer 120, and may extend at a maximum to outer edges of (e.g., aligned with outer edges) the upper metal layer 120. An etchant containing fluoric acid may be used to collectively etch the upper metal layer 120 and the lower metal layer 100 in forming the lower layer 110p and the upper layer 120p of a wire portion.

A portion of the substrate 100 may also be etched in the process of etching the upper metal layer 120 and the lower etching layer 110. Therefore, a step may be formed between the portion of the substrate 100 which overlaps the lower metal layer 110 (e.g., aligns with outer edges of the lower metal layer 110) and the portion of the substrate 100 which is not overlapped by the photoresist pattern. A thickness d of the etched portion of the substrate 100 may be about 300 Å to about 400 Å.

The upper layer 120p and the lower layer 110p may each have a tapered lateral side, and may be inclined at an angle between 0 degrees and about 50 degrees, with respect to the substrate 100.

Figure 3:
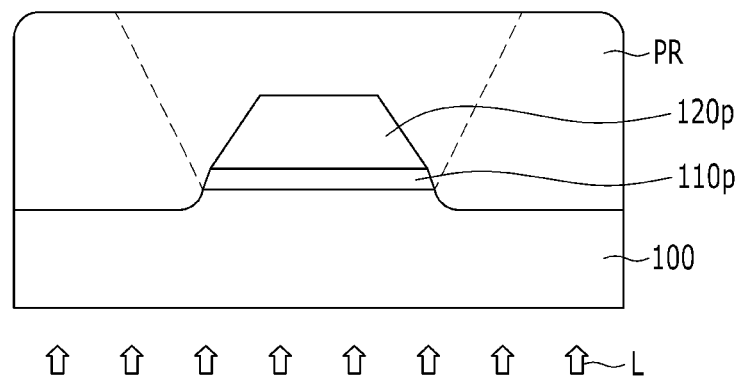

Referring to FIG. 3, a photoresist layer PR is formed to cover (e.g., overlap) the etched portion of the substrate 100, the lower layer 110p, and the upper layer 120p. Then, the photoresist layer PR is exposed by radiating light L through a lower surface of the substrate 100. That is, the photoresist layer PR is exposed by performing rear exposure, using a metal layer including the lower layer 110p and the upper layer 120p, as a mask. The photo resist layer PR is a negative type photoresist.

Figure 4:
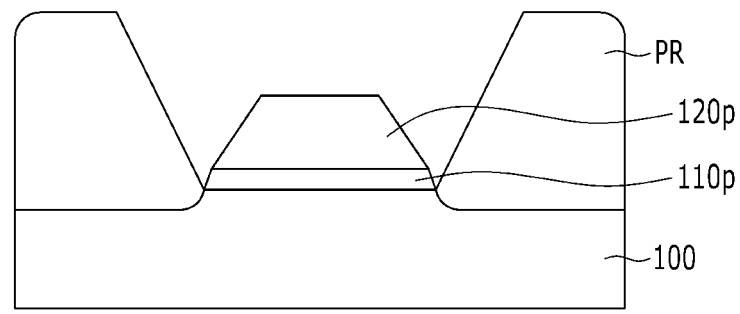

Referring to FIG. 4, a portion of the photoresist layer PR remains where the light is radiated and the upper layer 120p and the lower layer 110p are not disposed. A portion of the photoresist layer PR which overlaps the lower layer 110p is removed.

As the portion of the photoresist layer PR overlapping the lower layer 110p is removed, the upper layer 120p and the lower layer 110p are exposed. The photoresist layer PR is a negative type, and the remaining portion of the photoresist layer PR has an inverse tapered shape as a result of the rear exposure.

Figure 5:
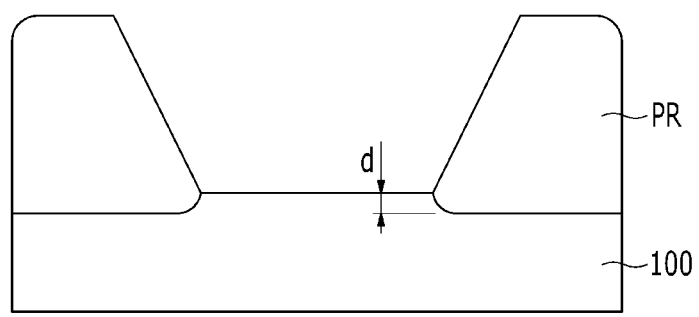

Referring to FIG. 5, the exposed upper layer 120p and the lower layer 110p are sequentially etched and removed, such as by an etchant. The etchant used in this process may be the same as the etchant that is used to collectively etch the upper metal layer 120 and the lower metal layer 110 in FIG. 2.

Figure 6:
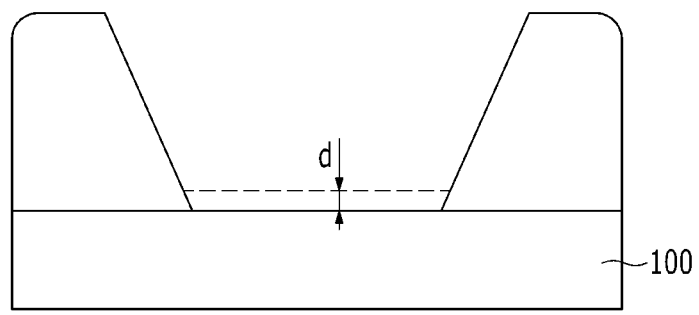

Referring to FIG. 6, the upper surface of the substrate 100 which is exposed by over-etching may be subsequently etched, after the upper layer 120p and the lower layer 110p are etched and removed. In this process, the step portion of the substrate 100 between the lower metal layer 110 and a remaining portion of the substrate 100 which has been formed in the process described with reference to FIG. 2, can be removed. The thickness d indicated by the dotted line in FIG. 6, illustrates where the removed step portion of the substrate 100 was located prior to etching.

Figure 7:
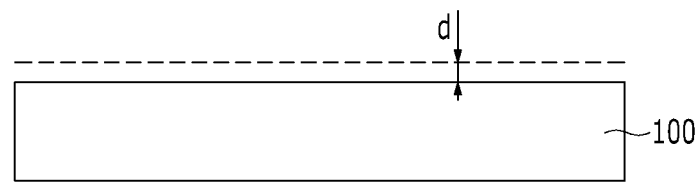

Referring to FIG. 7, a flattened substrate 100 is formed by developing the photoresist layer PR and removing the remaining photoresist layer PR. The flattened substrate 100 includes a continuous planar upper surface which is planarized after the upper layer 120p and the lower layer 110p are etched and removed.

The flattening method of a substrate that has been described above with reference to FIG. 1 to FIG. 7 may be applied to a reprocess of forming the wiring pattern again, after removing the wiring pattern such as due to a problem in the initially formed the wire pattern.

Figure 8:
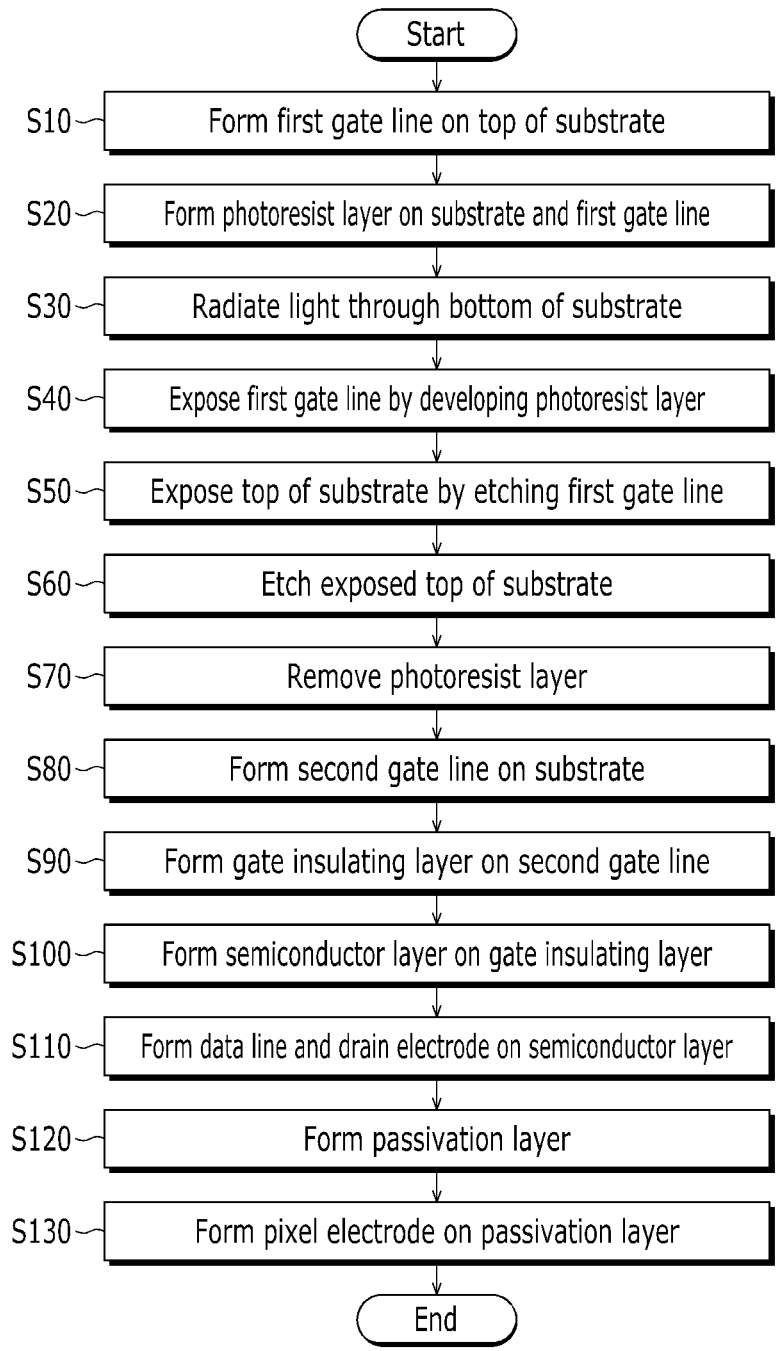
FIG. 8 is a flowchart illustrating an exemplary embodiment of a method of manufacturing a thin film transistor array panel according to the present invention.
Figure 9:
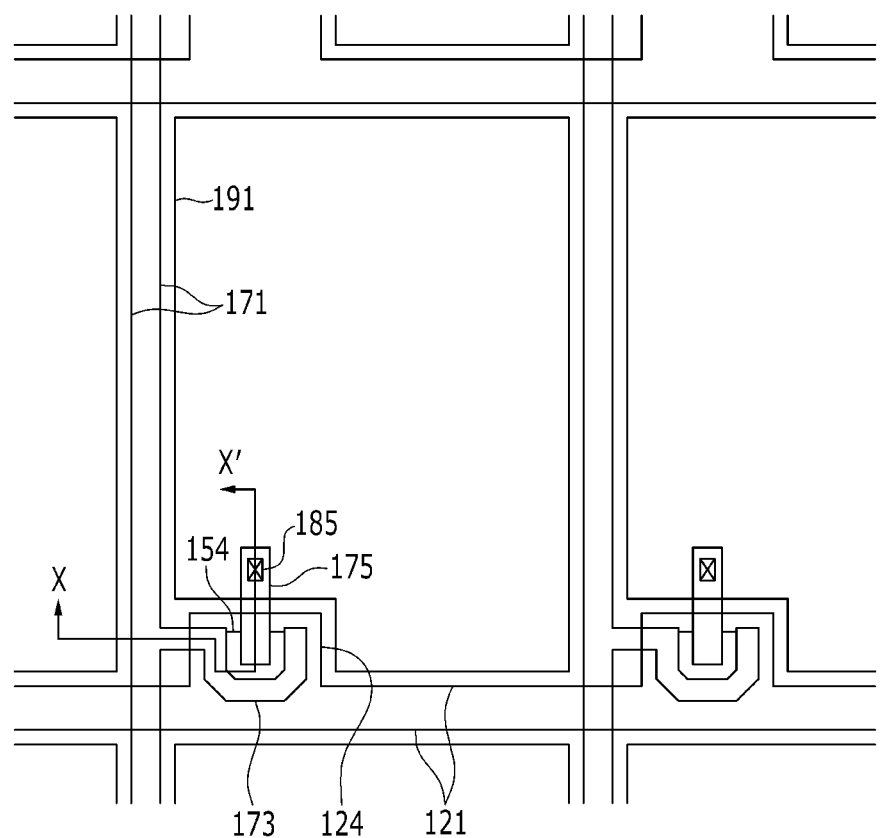
FIG. 9 is a top plan view showing an exemplary embodiment of a portion of the thin film transistor array panel manufactured by the method of FIG. 8.
Figure 10:
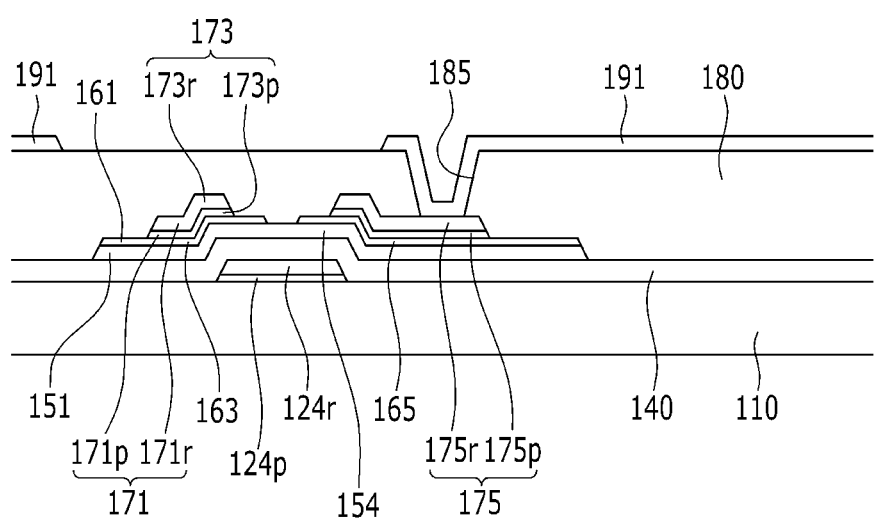
FIG. 10 is a cross-sectional view taken along line X-X' of FIG. 9.

FIG. 8 is a flowchart illustrating an exemplary embodiment of a method of manufacturing a thin film transistor ("TFT") array panel according to the present invention. FIG. 9 is a top plan view showing the TFT array panel manufactured by the method of FIG. 8. FIG. 10 is a cross-sectional view taken along line X-X' of FIG. 9.

Referring to FIG. 8 to FIG. 10, a first gate line is initially formed on an insulation substrate 110 including transparent glass or plastic (S10). The first gate line includes a lower layer and an upper layer. A plurality of the first gate line may be formed on the insulation substrate 110.

In detail, a lower metal layer and an upper metal layer are sequentially stacked on the insulation substrate 110, and then the upper metal layer and the lower metal layer are collectively etched such as by photolithography, thereby forming the first gate lines each including the lower layer and the upper layer sequentially stacked on the insulation substrate 110.

The first gate lines may be formed incorrectly or be defective in an initial process of forming the first gate lines. When the first gate lines are formed incorrectly or are defective, a reprocess may be performed, as described above in the exemplary embodiment shown in FIG. 3 to FIG. 7.

In other words, for the reprocess, a photoresist layer is formed directly on upper and side surfaces of the insulation substrate 110 and the first gate lines, respectively. (S20). Further, light is radiated through a bottom of the insulation substrate 110 (S30), and portions of the first gate lines are exposed by developing the photoresist layer (S40).

Thereafter, the exposed first gate lines are removed by etching, and a portion of the upper surface of the insulation substrate 110 is exposed (S50). Further, the photoresist layer is removed (S70), after the top of the exposed insulation substrate 110 is etched (S60). A substrate 110 including an entirely planar upper surface (e.g., a flattened substrate) is formed by the removing the first gate lines (S50), the etching of a stepped portion of the substrate using the remaining portion of the photoresist layer (S60) and removing the remaining portion of the photoresist layer (S70).

A plurality of second gate lines 121 is formed on the insulation substrate 110 that has been previously flattened in the processes described above (S80).

The second gate lines 121 transmit gate signals and are extended in a first direction, such as a horizontal direction in the plan view of FIG. 9. The gate lines 121 each include a plurality of gate electrodes 124 protruding from the gate lines 121. A gate line 121 and the gate electrodes 124 protruding therefrom, collectively form a single, unitary indivisible member. The gate lines 121 and the gate electrodes 124 may be considered as the gate wire of the TFT array panel.

The gate line 121 and the gate electrode 124 each have a dual-layer structure, such as including a lower layer 124p and an upper layer 124r. The lower layer 124p includes titanium (Ti) or a titanium alloy, and the upper layer 124r includes copper (Cu) or a copper alloy.

A gate insulating layer 140 including an insulating material, such as silicon nitride, is formed on the gate line 121 (S90).

A semiconductor layer 151 including hydrogenated amorphous silicon or polycrystalline silicon, is formed on the gate insulating layer 140 (S100).

The semiconductor layer 151 longitudinally extend in the first direction and have a plurality of projections 154 extending toward the gate electrode 124.

A plurality of ohmic contact stripes 161 and ohmic contact islands 165 are formed on the projections 154 of the semiconductor layer 151. The ohmic contact stripes 161 have a plurality of projections 163, and the projections 163 and the ohmic contact islands 165 are respectively disposed in pairs on the projections 154 of the semiconductor layer 151.

A plurality of data lines 171 and a plurality of drain electrodes 175 are formed on the ohmic contacts 161 and 165, and on the gate insulating layer 140 (S110). The date lines 171 and the drain electrodes 175 may be considered as the data wire of the TFT array panel.

The data line 171 transmits data signals and extends longitudinally in a second direction different from the first direction, and intersects the gate line 121. Each of the data line 171 includes a plurality of source electrodes 173 extending in a U-shape toward the gate electrode 124, in the plan view.

The drain electrode 175 is separated from the data line 171, and extends in the second direction at a middle portion of the U-shape of the source electrode 173 in the plan view.

The data line 171 including the source electrode 173, and the drain electrode 175, also have a dual-layer structure including the upper layers 171r, 173r, and 175r and the lower layers 171p, 173p, and 175p. The upper layers 171r, 173r, and 175r include copper (Cu) or a copper alloy, and the lower layers 171p, 173p, and 175p include one of titanium (Ti), tantalum (Ta), molybdenum (Mo), and an alloy thereof.

The lower layers 171p, 173p, and 175p, and the upper layers 171r, 173r, and 175r, of the data line 171 and the drain electrode 175, respectively, each have a tapered lateral side in a cross-sectional view.

The ohmic contacts 161, 163, and 165 are only in between the semiconductors 151 and 154 thereunder, and the lower layers 171p, 173p, and 175p of the data line 171 and the drain electrode 175 thereabove. The ohmic contacts 161, 163, and 165 reduce contact resistance between the semiconductors 151 and 154, and the lower layers 171p, 173p, and 175p, respectively. Further, the ohmic contacts 161, 163, and 165 may have substantially the same plane pattern as the lower layers 171p, 173p, and 175p of the data lines 171 and the drain electrodes 175, respectively.

In addition, a portion of the semiconductor layer 151 between the source electrode 173 and the drain electrode 175 is exposed, and not overlapped by the data line 171 and the drain electrode 175. The exposed portion is formed at the projection 154 of the semiconductor layer 151. The semiconductor layer 151 may have substantially the same plane pattern as the ohmic contacts 161 and 165, except for the exposed portion of the projection 154.

One gate electrode 124, one source electrode 173, and one drain electrode 175 constitute one TFT, together with the projection 154 of the semiconductor layer 151. The channel of the TFT is defined at the exposed portion of the projection 154 between the source electrode 173 and the drain electrode 175.

A passivation layer 180 is formed on the data line 171, the drain electrode 175, and the projection 154 of the exposed semiconductor layer (S120).

The passivation layer 180 includes an inorganic insulator, such as silicon nitride or silicon oxide, an organic insulator, or a low dielectric insulator.

The passivation layer 180 directly contacts portions of an upper surface of the lower layers 171p, 173p, and 175p which are partially exposed from the outer edges of the upper layers 171r, 173r, and 175r, and portions of surfaces of the semiconductor layer 151 partially exposed from the horizontal outer edges of the lower layers 171p, 173p, and 175p.

A plurality of contact holes 185 exposing ends of the drain electrodes 175 is formed extending completely through a thickness of the passivation layer 180.

A plurality of pixel electrodes 191 is formed on the passivation layer 180 (S130).

The pixel electrode 191 may include a transparent conductor, such as indium tin oxide ("ITO") or indium zinc oxide ("IZO").

The pixel electrode 191 is physically and electrically connected with the drain electrode 175 through the contact hole 185, and receives data voltage from the drain electrode 175. The pixel electrode 191 that has received the data voltage generates an electric field, together with a common electrode (not shown) which receives common voltage, thereby determining the direction of the liquid crystal molecules in the liquid crystal layer (not shown) between the two electrodes. The common electrode but may be formed on a display panel opposing the TFT array panel, or alternative on the TFT array panel The pixel electrode 191 and the common electrode collectively constitute a capacitor (hereafter, referred to as a "liquid crystal capacitor") to keep the voltage even after the TFT is turned off.

The pixel electrode 191 may form a storage capacitor by overlapping a storage electrode line (not shown), such that the performance of the liquid crystal capacitor which keeps the voltage can be improved.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A method of flattening a substrate, the method comprising:
   forming a metal layer on an upper surface of a substrate;
   forming a photoresist layer overlapping the substrate and the metal layer;
   radiating light to the photoresist layer, through a lower surface of the substrate opposite to the upper surface;
   exposing the metal layer by developing the photoresist layer;
   exposing the upper surface of the substrate by etching the metal layer;
   etching the exposed upper surface of the substrate; and
   removing the photoresist layer.

2. The method of claim 1, wherein:
   the radiating light to the photoresist layer uses the metal layer as a mask.

3. The method of claim 2, wherein
   the metal layer includes a double layer comprising an upper layer and a lower layer, the lower layer including titanium (Ti) and the upper layer including copper (Cu).

4. The method of claim 3, wherein:
   the forming the metal layer on the upper surface of the substrate includes:
   stacking a lower metal layer on the substrate;

stacking an upper metal layer on the lower metal layer;
forming a photoresist pattern on the upper metal layer;
etching the upper metal layer and the lower metal layer with a first etchant, using the photoresist pattern as a mask; and
removing the photoresist pattern,
wherein in the etching the upper metal layer and the lower metal layer with a first etchant, a step portion of the substrate is formed between a portion of the substrate which overlaps the lower metal layer and a portion of the substrate which is not overlapped by the photoresist pattern.

5. The method of claim 4, wherein:
the first etchant contains fluoric acid.

6. The method of claim 5, wherein:
the photoresist layer is a negative type.

7. The method of claim 1, wherein:
the forming the metal layer on the upper surface of the substrate includes forming a step portion of the substrate, and
the etching the exposed upper surface of the substrate removes the step portion.

8. The method of claim 7, wherein:
the etching the exposed upper surface of the substrate uses an etchant containing fluoric acid.

9. The method of claim 8, wherein:
the upper surface of the substrate is planarized, after the etching the exposed upper surface of the substrate.

10. A method of manufacturing a thin film transistor array panel, the method comprising:
forming a first gate line on an upper surface of a substrate;
forming a photoresist layer overlapping the substrate and the first gate line;
radiating light to the photoresist layer, through a lower surface of the substrate opposite to the upper surface;
exposing the first gate line by developing the photoresist layer;
exposing the upper surface of the substrate by etching the first gate line;
etching the exposed upper surface of the substrate;
removing the photoresist layer;
forming a second gate line on the upper surface of the substrate;
forming a gate insulating layer on the second gate line;
forming a semiconductor layer on the gate insulating layer;
forming a data line including a source line and a drain electrode, on the semiconductor layer;
forming a passivation layer on the data line and the drain electrode, the passivation layer including a contact hole; and
forming a pixel electrode connected with the drain electrode through the contact hole, on the passivation layer.

11. The method of claim 10, wherein:
the radiating light to the photoresist layer uses the first gate line as a mask.

12. The method of claim 11, wherein:
the first gate line and the second gate line each include a double layer comprising an upper layer and a lower layer, the lower layer including titanium (Ti), and the upper layer including copper (Cu).

13. The method of claim 12, wherein:
the forming the first gate line on the upper surface of the substrate includes:
stacking a lower metal layer on the substrate;
stacking an upper metal layer on the lower metal layer;
forming a photoresist pattern on the upper metal layer;
etching the upper metal layer and the lower metal layer with a first etchant, using the photoresist pattern as a mask; and
removing the photoresist pattern,
wherein in the etching the upper metal layer and the lower metal layer with a first etchant, a step portion of the substrate is formed between a portion of the substrate which overlaps the lower metal layer and a portion of the substrate which is not overlapped by the photoresist pattern.

14. The method of claim 13, wherein:
the first etchant contains fluoric acid.

15. The method of claim 14, wherein:
the photoresist layer is a negative type.

16. The method of claim 10, wherein:
the forming the first gate line on the upper surface of the substrate includes forming a step portion of the substrate, and
the etching the exposed upper surface of the substrate removes the step portion.

17. The method of claim 16, wherein:
the etching the exposed upper surface of the substrate uses an etchant containing fluoric acid.

18. The method of claim 17, wherein:
the upper surface of substrate is planarized, after the etching the exposed upper surface of the substrate, and before the forming the second gate line on the upper surface of the substrate.

\* \* \* \* \*